(12) United States Patent
Kim et al.

(10) Patent No.: US 11,797,136 B2
(45) Date of Patent: Oct. 24, 2023

(54) ELECTRONIC DEVICE (71) Applicant: Samsung Display Co., Ltd., Yongin-Si (KR)

(72) Inventors: Changbum Kim, Pyeongtaek-si (KR); Siyoung Choi, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/544,199

(22) Filed: Dec. 7, 2021

(65) Prior Publication Data
US 2022/0197432 A1 Jun. 23, 2022

(30) Foreign Application Priority Data

Dec. 21, 2020 (KR) .......................... 10-2020-0179391

(51) Int. Cl.
G06F 3/044 (2006.01)
(52) U.S. Cl.
CPC .. G06F 3/0443 (2019.05); *G06F 2203/04107* (2013.01)
(58) Field of Classification Search
CPC ......... G06F 3/0443; G06F 2203/04107; G06F 3/04164; G06F 3/041; G06F 2203/04102; G06F 2203/04103; G06F 3/0446; G06F 3/0421; G06F 3/0445; G06F 2203/04109; G06F 2203/04111; G06F 2203/04112; H05K 1/18; H05K 1/189
See application file for complete search history.

(56) References Cited

U.S. PATENT DOCUMENTS

| 7,932,893 B1* | 4/2011 | Berthaud ............... G04G 21/00 368/230 |
| 10,860,124 B2 | 12/2020 | Jeong et al. |
| 2016/0147361 A1* | 5/2016 | Ahn ....................... G06F 3/041 345/173 |
| 2021/0132666 A1 | 5/2021 | Kim et al. |

FOREIGN PATENT DOCUMENTS

| KR | 10-2019-0052765 | 5/2019 |
| KR | 10-2020-0084677 | 7/2020 |
| KR | 10-2021-0054091 | 5/2021 |

OTHER PUBLICATIONS

Machine translation of Dongwoo KR20200084677A (Year: 2020).*

* cited by examiner

*Primary Examiner* — Patrick N Edouard
*Assistant Examiner* — Joseph P Fox
(74) *Attorney, Agent, or Firm* — F. Chau & Associates, LLC (57) ABSTRACT An electronic device includes a display panel. A touch panel is disposed on the display panel. A printed circuit film is electrically connected to the touch panel and includes a first portion having a first thickness, and a second portion having a second thickness greater than the first thickness. A boundary between the first portion and the second portion overlaps the touch panel in a thickness direction of the touch panel and at least a portion of the second portion contacts the touch panel.

20 Claims, 9 Drawing Sheets

ELECTRONIC DEVICE

CROSS-REFERENCE TO RELATED APPLICATIONS

This application claims priority under 35 U.S.C. § 119 to Korean Patent Application No. 10-2020-0179391, filed on Dec. 21, 2020 in the Korean Intellectual Property Office, the disclosure of which is incorporated by reference in its entirety herein.

1. TECHNICAL FIELD

The present inventive concepts herein relate o an electronic device with increased product reliability.

2. DISCUSSION OF RELATED ART

Various multimedia electronic devices include display panels for displaying images, such as televisions, mobile phones, tablet computers, navigation systems, and game machines. The multimedia electronic device may also include an input sensor that provides a touch-based input method that enables a user to easily input information or commands intuitively and conveniently in addition to conventional input ways such as buttons, keyboards, and mouse devices.

SUMMARY

The present inventive concepts provide an electronic device with increased product reliability.

According to an embodiment of the present inventive concepts, an electronic device includes a display panel. A touch panel is disposed on the display panel. A printed circuit film is electrically connected to the touch panel and includes a first portion having a first thickness, and a second portion having a second thickness greater than the first thickness. A boundary between the first portion and the second portion overlaps the touch panel in a thickness direction of the touch panel and at least a portion of the second portion contacts the touch panel.

In an embodiment, the electronic device may further include an optical film disposed on the touch panel, wherein the first portion may be disposed between the optical film and the touch panel.

In an embodiment, the boundary between the first portion and the second portion may be disposed between the optical film and the touch panel.

In an embodiment, a first side of the optical film and a second side of the touch panel may be defined, and each of the first side and the second side may overlap the second portion of the printed circuit film.

In an embodiment, the second side of the touch panel may protrude more than the first side of the optical film.

In an embodiment, the second side of the touch panel may be aligned with the first side of the optical film.

In an embodiment, the optical film may be attached to one surface of the printed circuit film.

In an embodiment, the electronic device may further include an adhesive layer disposed between the optical film and the touch panel and an insulating layer disposed between the adhesive layer and the touch panel, wherein the adhesive layer and the insulating layer may be spaced apart from the printed circuit film.

In an embodiment, the optical film may be attached to the adhesive layer and the printed circuit film, and an upper surface of the adhesive layer attached to the optical film may be aligned with a portion of an upper surface of the printed circuit film attached to the optical film.

in an embodiment, the printed circuit film may include a base layer, a conductive layer disposed on one surface of the base layer, and a coverlay configured to cover the conductive layer, and the boundary may be defined by an end of the coverlay.

In an embodiment, the coverlay may be in contact with the touch panel.

In an embodiment, the touch panel may include an edge extending in a first direction, the printed circuit film may cover at least a portion of the edge, and a length of the edge may be greater than a width of the printed circuit film in a direction parallel to the first direction.

In an embodiment, the touch panel may have a sensing region for sensing an external input and a peripheral region adjacent to the sensing region, the sensing region and the peripheral region being defined therein; the touch panel may include a plurality of electrodes disposed in the sensing region and a plurality of pads disposed in the peripheral region and arranged along the first direction; and when viewed in a thickness direction of the touch panel, the boundary between the first portion and the second portion may be arranged between the edge and the plurality of pads.

In an embodiment, a boundary between the sensing region and the peripheral region may be a curved line or a circle.

According to an embodiment of the present inventive concepts, an electronic device includes a display panel. A touch panel is disposed on the display panel. A printed circuit film is electrically connected to the touch panel. An optical film is disposed on the touch panel. The printed circuit film includes a base layer, a conductive layer disposed on a first surface of the base layer, and a coverlay configured to cover at least a portion of the conductive layer. A portion of the printed circuit film is disposed between the optical film and the touch panel in a direction that is a thickness direction of the touch panel. An end of the coverlay is disposed on the touch panel.

In an embodiment, the end of the coverlay may be disposed between the optical film and the touch panel.

In an embodiment, when viewed in a thickness direction of the touch panel, the end of the coverlay may be spaced apart from the optical film.

In an embodiment, a first side of the optical film and a second side of the touch panel may be defined, and each of the first side and the second side may overlap the coverlay of the printed circuit film.

In an embodiment, the second side of the touch panel may protrude more than the first side of the optical film.

In an embodiment, the touch panel may include an edge extending along a first direction, the printed circuit film may cover at least a portion of the edge, and a length of the edge may be greater than a width of the printed circuit film in a direction parallel to the first direction.

According to an embodiment of the present inventive concepts, an electronic device includes a display panel. A touch panel is disposed on the display panel. A printed circuit film is electrically connected to the touch panel and includes a first portion having a first thickness, and a second portion having a second thickness greater than the first thickness. A boundary is between the first portion and the second portion. The boundary contacts the touch panel.

BRIEF DESCRIPTION OF THE DRAWINGS

The accompanying drawings are included to provide a further understanding of the present inventive concepts, and are incorporated in and constitute a part of this specification. The drawings illustrate embodiments of the present inventive concepts and, together with the description, serve to explain principles of the present inventive concepts. In the drawings.

DETAILED DESCRIPTION OF EMBODIMENTS

In this specification, it will be understood that when an element (or region, layer, portion, etc.) is referred to as being "on", "connected to" or "coupled to" another element, it can be directly on, connected or coupled to the other element, or intervening elements may be present. When an element (or region, layer, portion, etc.) is referred to as being "directly on", "directly connected to" or "directly coupled to" another element, no intervening elements may be present.

Like reference numerals refer to like elements throughout. In addition, in the drawings, the thicknesses, ratios, and dimensions of elements are exaggerated for effective description of the technical contents.

As used herein, the tern "and/or" includes any and all combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the present inventive concepts. Similarly, the second element may also be referred to as the first element. The terms of a singular form include plural forms unless otherwise specified.

Terms, such as "below", "lower", "above", "upper" and the like, are used herein for ease of description to describe the relationship of one element to another element(s) as illustrated in the figures. The above terms are relative concepts and are described based on the directions indicated in the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof.

Hereinafter, embodiments of the present inventive concepts will be explained in detail with reference to the accompanying drawings.

Figure 1:
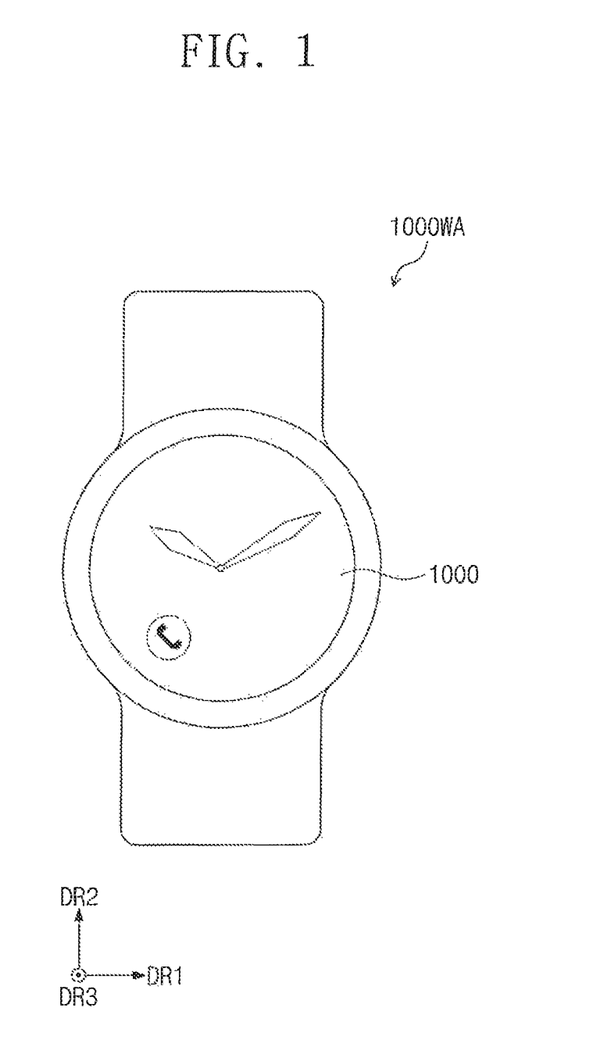
FIG. 1 is an application example of an electronic device according to an embodiment of the present inventive concepts.

FIG. 1 is an application example of an electronic device according to an embodiment of the present inventive concepts.

Referring to the embodiment of FIG. 1, the electronic device 1000 may be applied to a wearable device 1000WA, such as a smartwatch. However, embodiments of the present inventive concepts are not limited thereto and the wearable device 1000WA may be various different electronic devices.

In an embodiment, the electronic device 1000 may display at least one moving and/or still image, such as time information, weather information, or icons for performing various applications or operations. However, embodiments of the present inventive concepts are not limited thereto and the images displayed by the electronic device 1000 may vary. In an embodiment, a user may operate the electronic device 1000 by touching a sensing region (e.g., an active region) of the electronic device 1000. As shown in the embodiment of FIG. 1, the electronic device 1000 may have a round shape in a plan view (e.g., in a plane defined in the first and second directions DR1, DR2). However, embodiments of the present inventive concepts are not limited thereto. For example, the electronic device 1000 may have various shapes such as a polygonal shape (e.g., a tetragonal shape) in a plan view.

Figure 2:
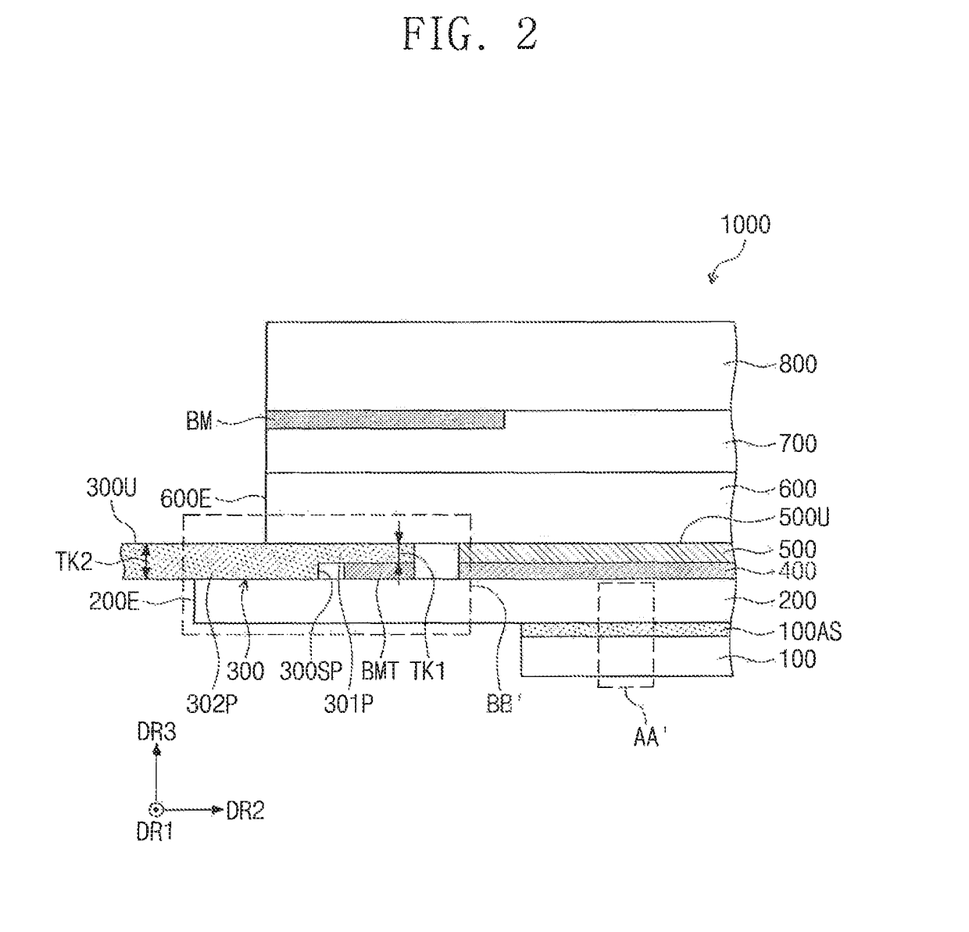
FIG. 2 is a cross-sectional view of the electronic device according to an embodiment of the present inventive concepts.

FIG. 2 is a cross-sectional view of the electronic device according to an embodiment of the present inventive concepts.

Referring to the embodiment of FIG. 2, the electronic device 1000 may include a display panel 100, a touch panel 200, a printed circuit film 300, an insulating layer 400, an adhesive layer 500, an optical film 600, a window adhesive layer 700, and a window 800. However, embodiments of the present inventive concepts are not limited thereto. For example, in some embodiments, at least one of the elements and/or configurations described above may be omitted, or other elements and/or configurations may be further added.

The display panel 100 may generate an image. In an embodiment, the display panel 100 may be a light-emitting display panel, such as an organic light-emitting display panel, a quantum dot display panel, a micro LED display panel, or a nano LED display panel. However, embodiments of the present inventive concepts are not limited thereto. For example, in an embodiment, the display panel 100 may be a light-receiving display panel, such as a liquid crystal display panel.

The touch panel 200 may be disposed on the display panel 100. The touch panel 200 may be attached to the display panel 100 by an adhesive layer 100AS. The touch panel 200 may sense an external input applied from the outside. For example, in an embodiment, the touch panel 200 may sense the external input by sensing a change in capacitance. However, embodiments of the present inventive concepts are not limited thereto.

The printed circuit film 300 may be electrically connected to the touch panel 200. For example, the printed circuit film 300 may be electrically connected to the touch panel 200 through an anisotropic conductive film BMT disposed between the printed circuit film 300 and the touch panel 200 (e.g., in the third direction DR3). The printed circuit film 300 may serve to provide a signal to the touch panel 200 or transmit a signal provided from the touch panel 200.

The printed circuit film 300 may include a first portion 301P and a second portion 302P. The first portion 301P may have a first thickness TK1 (e.g., length in the third direction DR3) and the second portion 302P may have a second thickness TK2 (e.g., length in the third direction DR3). As shown in the embodiment of FIG. 2, the second thickness TK2 may be greater than the first thickness TK1. For example, in an embodiment, the number of layers constituting the first portion 301P may be less than the number of layers constituting the second portion 302P.

A boundary 300SP between the first portion 301P and the second portion 302P may be disposed on the touch panel 200. For example, when viewed in the thickness direction of the touch panel 200, for example, in the third direction DR3, the boundary 300SP between the first portion 301P and the second portion 302P may overlap the touch panel 200. In addition, in an embodiment, at least a portion of the second portion 302P of the printed circuit film 300 may be in direct contact with the touch panel 200. For example, as shown in the embodiment of FIG. 2, a portion of the lower surface of the second portion 302P my directly contact an upper surface of the touch panel 200. However embodiments of the present inventive concepts are not limited thereto.

The boundary 300SP between the first portion 301P and the second portion 302P may correspond to a region in which the thickness of the printed circuit film 300 changes. In a comparative embodiment, when a force is applied to the printed circuit film 300, the force may be concentrated on the boundary 300SP of the printed circuit film 300. However, according to an embodiment of the present inventive concepts, since the boundary 300SP is disposed on the touch panel 200 and overlaps the touch panel 200 (e.g., in the third direction DR3), the force applied from the outside may not be concentrated on the boundary 300SP, thus increasing the reliability of the electronic device 1000.

The optical film 600 may be disposed above the touch panel 200. For example, as shown in the embodiment of FIG. 2, a lower surface of the optical film 600 may directly contact upper surfaces of the adhesive layer 500 and the printed circuit film 300. In an embodiment, the optical film 600 may lower the reflectance of light incident from the outside. The optical film 600 may include a retarder and/or a polarizer. The optical film 600 may include at least a polarizing film.

The first portion 301P of the printed circuit film 300 may be disposed between the optical film 600 and the touch panel 200 (e.g., in the third direction DR3). A portion of the optical film 600 may be attached to a portion of the upper surface 300U of the printed circuit film 300. For example, as shown in the embodiment of FIG. 2, a portion of the lower surface of the optical film 600 may directly contact an entire portion of the upper surface of the first portion 301P of the printed circuit film 300 and a portion of an upper surface of the second portion 302P of the printed circuit film 300. However, embodiments of the present inventive concepts are not limited thereto. The boundary 300SP between the first portion 301P and the second portion 302P may be disposed between the optical film 600 and the touch panel 200 (e.g., in a third direction DR3). For example, since the boundary 300SP has a shape that is fixed between the touch panel 200 and the optical film 600, a phenomenon that the boundary 300SP of the printed circuit film 300 is bent or folded may be prevented or eliminated.

The insulating layer 400 and the adhesive layer 500 may be further disposed between the optical film 600 and the touch panel 200 (e.g., in the third direction DR3). For example, the adhesive layer 500 may be disposed between the optical film 600 and the touch panel 200 (e.g., in the third direction DR3), and the insulating layer 400 may be disposed between the touch panel 200 and the adhesive layer 500 (e.g., in the third direction DR3). The insulating layer 400 and the adhesive layer 500 may be spaced apart from the printed circuit film 300 in a direction parallel to an upper surface of the touch panel 200, such as the second direction DR2.

The insulating layer 400 may be referred to as a passivation layer and may be a layer provided to protect the upper surface of the touch panel 200. However, embodiments the present inventive concepts are not limited thereto. For example, in an embodiment, the insulating layer 400 may be omitted.

In an embodiment, the adhesive layer 500 may be an optically clear adhesive OCA. For example, a first surface of the optical film 600, for example, a bottom surface, or a surface facing the touch panel 200 may have adhesive properties. In this embodiment, a portion of the optical film 600 may be attached to the printed circuit film 300. The adhesive layer 500 may be disposed in a space between the touch panel 200 and the optical film 600 (e.g., in the third direction DR3), in which the printed circuit film 300 is not interposed therebetween. The adhesive layer 500 may serve to compensate for a step difference between the surfaces to which the optical film 600 is attached. Therefore, the upper surface 500U of the adhesive layer 500 attached to the optical film 600 may be aligned with a portion of the upper surface 300U of the printed circuit film 300 attached to the optical film 600. For example, the upper surface 500U of the adhesive layer 500 and a portion of the upper surface 300U of the printed circuit film 300 attached to the optical film 600 may be at the same level as each other (e.g., co-planar in the third. direction DR3) or have the same height from the touch panel 200.

The window 800 may be disposed on the optical film 600. The window 800 may be glass or chemically strengthened glass. In an embodiment, the window 800 may include a synthetic resin film instead of glass. The window 800 may be combined with the optical film 600 by the window adhesive layer 700.

A bezel pattern BM may be disposed on a first surface of the window 800. For example, the embodiment of FIG. 2 shows the bezel pattern BM disposed on a portion of the lower surface of the window 800. However, embodiments of the present inventive concepts are not limited thereto and the position of the bezel pattern BM may vary. The bezel pattern BM is a colored light-shielding film and may be formed, for example, by a coating method. The bezel pattern BM may include a base material and a dye or pigment mixed with the base material. The bezel pattern BM may have a closed line shape on a plane.

When viewed in the thickness direction of the touch panel 200, for example, in the third direction DR3, sides overlapping the printed circuit film 300 may be defined. For example, a first side 600E of the optical film 600 and a second side 200E of the touch panel 200 may be defined. When viewed in a plan view, the first side 600E of the optical film 600 and the second side 200E of the touch panel 200 may be spaced apart from each other (e.g., in the second direction DR2). For example, the second side 200E of the touch panel 200 may protrude (e.g., outwardly in the second direction DR2) more than the first side 600E of the optical film 600. Since the protruding, extended touch panel 200 is in direct contact with a portion of the printed circuit film 300, when the printed circuit film 300 is bent, stress received by the printed circuit film 300 may be relieved.

Figure 3:
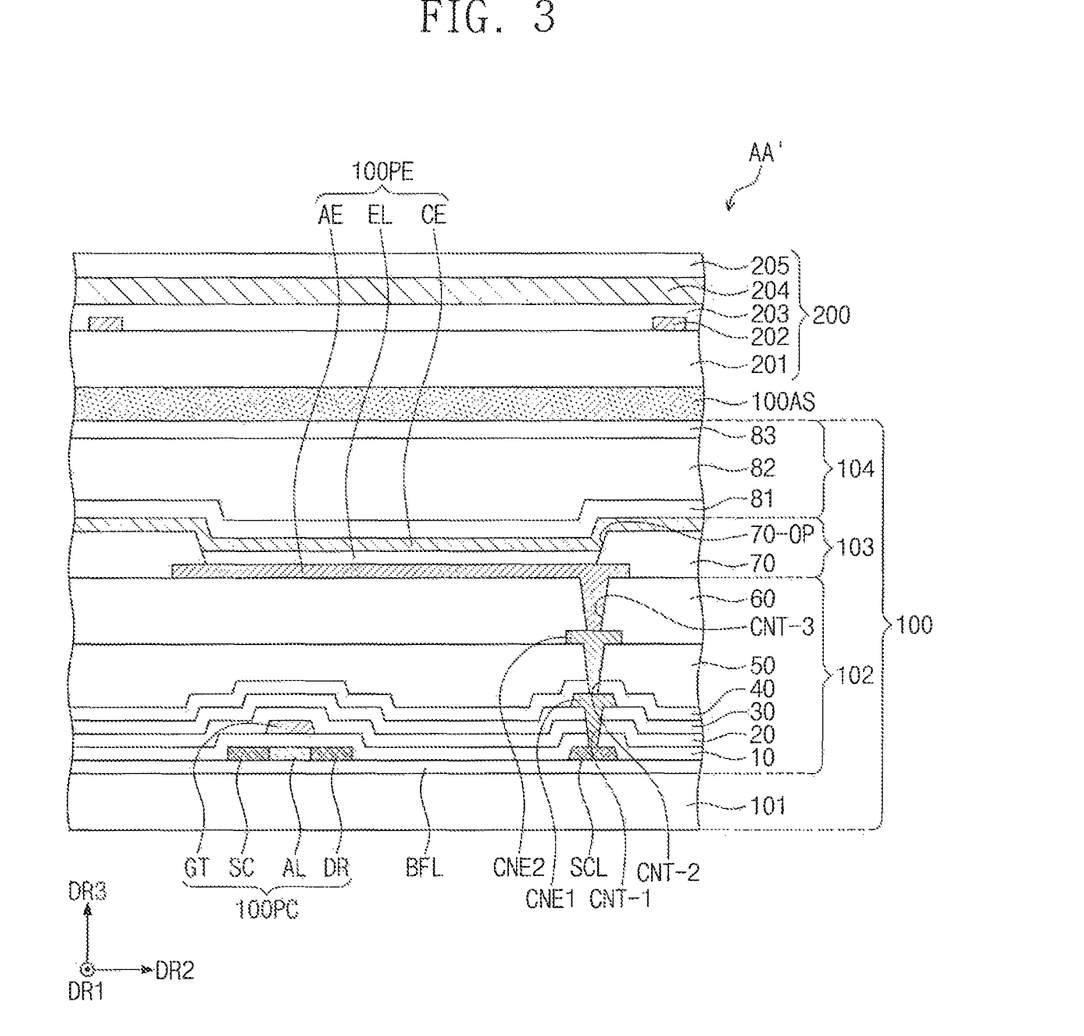
FIG. 3 is an enlarged cross-sectional view illustrating region AA' of FIG. 2 according to an embodiment of the present inventive concepts.

FIG. 3 is an enlarged cross-sectional view illustrating region AA' of FIG. 2.

Referring to FIGS. 2 and 3, the display panel 100 may include a base layer 101 (e.g., a first base layer), a circuit layer 102, a light-emitting element layer 103, and an encapsulation layer 104.

The base layer 101 may be a member for providing a base surface on which the circuit layer 102 is disposed. In an embodiment, the base layer 101 may be a glass substrate, a metal substrate, a polymer substrate or the like. However, embodiments of the present inventive concepts are not limited thereto, and the base layer 101 may be an inorganic layer, an organic layer, or a composite material layer.

The base layer 101 may have a multi-layered structure. For example, in an embodiment, the base layer 101 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. However, embodiments of the present inventive concepts are not limited thereto. The silicon oxide layer and the amorphous silicon layer may be referred to as base barrier layers.

In an embodiment, each of the first and second synthetic resin layers may contain a polyimide-based resin. In addition, each of the first and second synthetic resin layers may contain at least one compound selected from an acrylate-based resin, a methacrylate-based a polyisoprenes-based resin, a vinyl-based resin, an epoxy-based resin, a urethane-based resin, a cellulose-based resin, a siloxane-based resin, a polyamide-based resin, or a perylene-based resin. In this specification, a "~"-based resin means to include a functional group of "~".

The circuit layer 102 may be disposed on the base layer 101 (e.g., directly thereon in the third direction DR3). In an embodiment, the circuit layer 102 may include an insulating layer, a semiconductor pattern, a conductive pattern, and a signal line. For example, an insulating layer, a semiconductor layer, and a conductive layer may be formed on the base layer 101 by coating, deposition, or the like, and thereafter, the insulating layer, the semiconductor layer, and the conductive layer may be selectively patterned through multiple photolithography processes. The semiconductor pattern, the conductive pattern, and the signal line included in the circuit layer 102 may then be formed.

At least one inorganic layer is formed on the upper surface of the base layer 101. In an embodiment, the inorganic layer may include at least one compound selected from aluminum oxide, titanium oxide, silicon oxide, silicon nitride, silicon oxynitride, zirconium oxide, and hafnium oxide. The inorganic layer may be formed in multiple layers. Multi-layered inorganic layers may constitute a barrier layer and/or a buffer layer. In the embodiment shown in FIG. 3, the display panel 100 is illustrated to include a buffer layer BFL disposed directly on the base layer 101. However, embodiments of the present inventive concepts are not limited thereto.

The buffer layer BFL may increase the bonding force between the base layer 101 and the semiconductor pattern. In an embodiment, the buffer layer BFL may include at least one compound selected from silicon oxide, silicon nitride, and silicon oxynitride. For example, the buffer layer BFL may include a structure in which a silicon oxide layer and a silicon nitride layer are alternately stacked.

The semiconductor pattern may be disposed on the buffer layer BFL. In an embodiment, the semiconductor pattern may contain polysilicon. However, embodiments of the present inventive concepts are not limited thereto. For example, in an embodiment, the semiconductor pattern may contain at least one compound selected from amorphous silicon, low-temperature polycrystalline silicon, and oxide semiconductor.

FIG. 3 illustrates a portion of the semiconductor pattern, and therefore, the semiconductor pattern may be further disposed in another region. The semiconductor pattern may be arranged according to a specific rule across pixels. The semiconductor pattern may have different electrical properties depending on whether they are doped or not. The semiconductor pattern may include a first region having high conductivity and a second region having low conductivity. In an embodiment, the first region may be doped with an n-type dopant or a p-type dopant. A p-type transistor may include a doped region doped with the p-type dopant, and an n-type transistor may include a doped region doped with the n-type dopant. The second region may be a non-doped region or a region doped with a concentration lower than that of the first region.

The conductivity of the first region is greater than the conductivity of the second region, and the first region may substantially serve as an electrode or signal line. The second region may substantially correspond to an active layer (e.g., a channel) of a transistor. For example, one portion of the semiconductor pattern may be the active layer of the transistor, another portion thereof may be a source or drain of the transistor, and another portion thereof may be a connection electrode or a connection signal line.

In an embodiment, each of the pixels may have an equivalent circuit including seven transistors, one capacitor, and a light emitting element. However, embodiments of the present inventive concepts are not limited thereto and the equivalent circuit diagram of the pixel may be modified in various forms. FIG. 3 illustrates, as an example, a transistor 100PC and a light-emitting element 100PC included in the pixel.

A source SC, an active layer AL, and a drain DR of the transistor 100PC may be formed from the semiconductor pattern. The source SC and the drain DR may extend in opposite directions from each other from the active layer AL in a cross section. For example, as shown in the embodiment of FIG. 3, the source SC the active layer AL, and the drain DR may be arranged in the second direction DR2. However, embodiments of the present inventive concepts are not limited thereto. FIG. 3 illustrates a portion of the connection signal line SCL disposed on the base layer 101 (e.g., directly thereon in the third direction DR3) and formed from the semiconductor pattern. In an embodiment, the connection signal line SCL may be connected to the drain DR of the transistor 100PC on a plane.

A first insulating layer 10 may be disposed on the buffer layer BFL (e.g., directly thereon in the third direction DR3). The first insulating layer 10 may overlap a plurality of pixels in common and cover the semiconductor pattern. The first insulating layer 10 may be an inorganic layer and/or an organic layer and have a single-layered or multi-layered structure. In an embodiment, the first insulating layer 10 may include at least one compound selected from aluminum oxide, titanium oxide, silicon oxide, silicon nitride, silicon oxynitride, zirconium oxide, an hafnium oxide. In this embodiment, the first insulating layer 10 may be a single-layered silicon oxide layer. Not only the first insulating layer 10 but also an insulating layer of the circuit layer 102 to be described later may be an inorganic layer and/or an organic layer and have a single-layered or multi-layered structure. The inorganic layer may contain at least one of the materials described above. However, embodiments of the present inventive concepts are not limited thereto.

A gate GT of the transistor 100PC is disposed on the first insulating layer 10 (e.g., directly thereon in the third direction DR3). The gate GT may be a portion of a metallic pattern. The gate GT overlaps the active layer AL (e.g., in the third direction DR3). In the process of doping the semiconductor pattern, the gate GT may function as a mask.

A second insulating layer 20 may be disposed on (e.g., directly thereon in the third direction DR3) the first insulating layer 10 and may cover the gate GT. In an embodiment, the second insulating layer 20 may overlap the pixels in common. The second insulating layer 20 may be an inorganic layer and/or an organic layer and have a single-layered or multi-layered structure. The second insulating layer 20 may include at least one compound selected from silicon oxide, silicon nitride, and silicon oxynitride. In this embodiment, the second insulating layer 20 may have a multi-layered structure including a silicon oxide layer and a silicon nitride layer.

A third insulating layer 30 may be disposed on the second insulating layer 20 (e.g., directly thereon in the third direction DR3). The third insulating layer 30 may have a single-layered or multi-layered structure. For example, the third insulating layer 30 may have a multi-layered structure including a silicon oxide layer and a silicon nitride layer.

A first connection electrode CNE1 may be disposed on the third insulating layer 30 (e.g., directly thereon in the third direction DR3). The first connection electrode CNE1 may be connected to the connection signal. SCL through a first contact hole CNT-1 penetrating the first, second and third insulating layers 10, 20, and 30.

A fourth insulating layer 40 may be disposed on the third insulating layer 30 (e.g., directly thereon in the third direction DR3). The fourth insulating layer 40 may be a single-layered silicon oxide layer. A fifth insulating layer 50 may be disposed on the fourth insulating layer 40 (e.g., directly thereon in the third direction DR3). In an embodiment, the fifth insulating layer 50 may be an organic layer.

A second connection electrode CNE2 may be disposed on the fifth insulating layer 50 (e.g., directly thereon in the third direction DR3). The second connection electrode CNE2 may be connected to the first connection electrode CNE1 through a second contact hole CNT-2 penetrating the fourth insulating layer 40 and the fifth insulating layer 50.

A sixth insulating layer 60 may be disposed on the fifth insulating layer 50 (e.g., directly thereon in the third direction DR3) and may cover the second connection electrode CNE2. The sixth insulating layer 60 may be an organic layer.

The light-emitting element layer 103 may be disposed on the circuit layer 102 (e.g., directly thereon in the third direction DR3). The light-emitting element layer 103 may include a light-emitting element. For example, in an embodiment, the light-emitting element layer 103 may include an organic light-emitting material, a quantum dot, a quantum rod, a micro LED, or a nano LED. Hereinafter, the light emitting element 100PE will be described to be an organic light-emitting element for convenience of explanation. However, embodiments of the present inventive concepts are not limited thereto.

The light-emitting element 100PE may include a first electrode AE, a light-emitting layer EL, and a second electrode CE.

The first electrode AE may be disposed on the sixth insulating layer 60 (e.g., directly thereon in the third direction DR3). The first electrode AE may be connected to the second connection electrode CNE2 through a third contact hole CNT-3 penetrating the sixth insulating layer 60.

A pixel defining film 70 may be disposed on the sixth insulating layer 60 (e.g., directly thereon in the third direction DR3) and may cover a portion of the first electrode AE. For example, as shown in the embodiment of FIG. 3, the pixel defining film 70 may cover lateral ends of the first electrode AE. The pixel defining film 70 has an opening 70-OP defined therein. The opening 70-OP of the pixel defining film 70 exposes at least a portion of the first electrode AE. For example, as shown in the embodiment of FIG. 3, the opening 70-OP may expose a central portion of the first electrode AE.

The light-emitting layer EL may be disposed on the first electrode AE (e.g., directly thereon in the third direction DR3). The light-emitting layer EL may be disposed in a region corresponding to the opening 70-OP. For example, the light-emitting layer EL may be formed to be separated for each of the pixels. When the light-emitting layer EL is formed separately from each of the pixels, each of the light-emitting layers EL may emit light in at least one color of blue, red, or green. However, the colors emitted by the discrete light-emitting layers EL may vary. Additionally, embodiments of the present inventive concepts are not limited thereto, and the light-emitting layer EL may be connected to each of the pixels and provided in common. In this embodiment, the light-emitting layer EL may provide blue light or white light.

The second electrode CE may be disposed on the light-emitting layer EL (e.g., directly thereon in the third direction DR3). The second electrode CE may have an integrated shape and be disposed in common in a plurality of pixels.

In an embodiment, a hole control layer may be disposed between the first electrode AE and the light-emitting layer EL (e.g., in the third direction DR3). The hole control layer may include a hole transport layer and further include a hole injection layer. An electronic control layer may be disposed between the light-emitting layer EL and the second electrode CE. The electronic control layer may include an electronic transport layer and further include an electronic injection layer. In an embodiment, the hole control layer and the electronic control layer may be formed in common to a plurality of pixels by using an open mask.

The encapsulation layer 104 may be disposed on the light-emitting element layer 103 (e.g., directly thereon in the third direction DR3). The encapsulation layer 104 may include a first inorganic layer 81, an organic layer 82, and a second inorganic layer 83 which are sequentially stacked. However, embodiments of the present inventive concepts are not limited thereto and the layers constituting the encapsulation layer 104 may vary. For example, the encapsulation layer 104 may include at least one inorganic layer and at least one organic layer and the numbers of the inorganic layers and the organic layers may vary.

The first and second inorganic layers 81 and 83 may protect the light-emitting element layer 103 from moisture and oxygen, and the organic layer 82 may protect the light-emitting element layer 103 from foreign materials such as dust particles. In an embodiment, the first and second inorganic layers 81 and 83 may include a silicon nitride layer, a silicon oxynitride layer, a silicon oxide layer, a titanium oxide layer, an aluminum oxide layer, or the like. The organic layer 82 may include an acrylic-based organic layer. However, embodiments of the present inventive concepts are not limited thereto.

FIG. 3 illustrates, as an example, that the light-emitting element layer 103 is sealed by the encapsulation layer 104. However, embodiments of the present inventive concepts are not limited thereto. For example, an encapsulation substrate may be disposed on the light-emitting element layer 103 instead of the encapsulation layer 104. In this embodiment, the encapsulation substrate may seal the light-emitting element layer 103 by a coupling member. The coupling member may contain an inorganic material or an organic material. For example, the inorganic material may include a frit seal, and the organic material may include a photocurable resin or a photoplastic resin. However, embodiments of the present inventive concepts are not limited thereto and the material constituting the coupling member may vary.

The touch panel 200 may be disposed on the display panel 100. The touch panel 200 may be combined with the display panel 100 by the adhesive layer 100AS. For example, in an embodiment, the adhesive layer 100AS may be an optically clear adhesive (OCA) member.

The touch panel 200 may include a base layer 201 (e.g., a second base layer), a first conductive layer 202, a sensing insulating layer 203, a second conductive layer 204, and a cover insulating layer 205. The first conductive layer 202 may be disposed on the base layer 201 (e.g., directly thereon in the third direction DR3), the sensing insulating layer 203 may be disposed on the first conductive layer 202 (e.g., directly thereon in the third direction DR3), the second conductive layer 204 may be disposed on the sensing insulating layer 203 (e.g., directly thereon in the third direction DR3), and the cover insulating layer 205 may be disposed on the second conductive layer 204 (e.g., directly thereon in the third direction DR3). However, embodiments of the present inventive concepts are not limited thereto. For example, in an embodiment, at least one insulating layer may be further disposed between the base layer 201 and the first conductive layer 202 (e.g., in the third direction DR3).

In an embodiment, the base layer 201 may be a glass substrate or a polymer substrate. However, embodiments of the present inventive concepts are not limited thereto and the materials of the base layer 201 may vary. For example, in an embodiment, the base layer 201 may include an inorganic layer, an organic layer, or a composite material layer. The base layer 201 may have a single-layered structure or a multi-layered structure.

Each of the first conductive layer 202 and the second conductive layer 204 may have a single-layered structure, or a multi-layered structure stacked along the third direction DR3.

A conductive layer having a single-layered structure may include a metal layer a transparent conductive layer. In an embodiment, the metal layer may contain molybdenum, silver, titanium, copper, aluminum, or an alloy thereof. The transparent conductive layer may contain transparent conductive oxide such as indium tin oxide (ITO), indium zinc oxide (IZO), zinc oxide (ZnO), or indium zinc tin oxide (IZTO). However, embodiments of the present inventive concepts are not limited thereto. In addition, the transparent conductive layer may contain conductive polymer such as PEDOT, metal nanowire, and graphene.

A conductive layer having a multi-layered structure may include metal layers. The metal layers may have, for example, a three-layer structure of titanium/aluminum/titanium. The conductive layer having a multi-layered structure may include at least one metal layer and at least one transparent conductive layer.

At least one of the sensing insulating layer 203 or the cover insulating layer 205 may include an inorganic layer. The inorganic layer may include at least one compound selected from aluminum oxide, titanium oxide, silicon oxide, silicon nitride, silicon oxynitride, zirconium oxide, and hafnium oxide.

At least one of the sensing insulating layer 203 or the cover insulating layer 205 may include an organic layer. The organic layer may include at least one material selected from an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, or a perylene-based resin.

Figure 4:
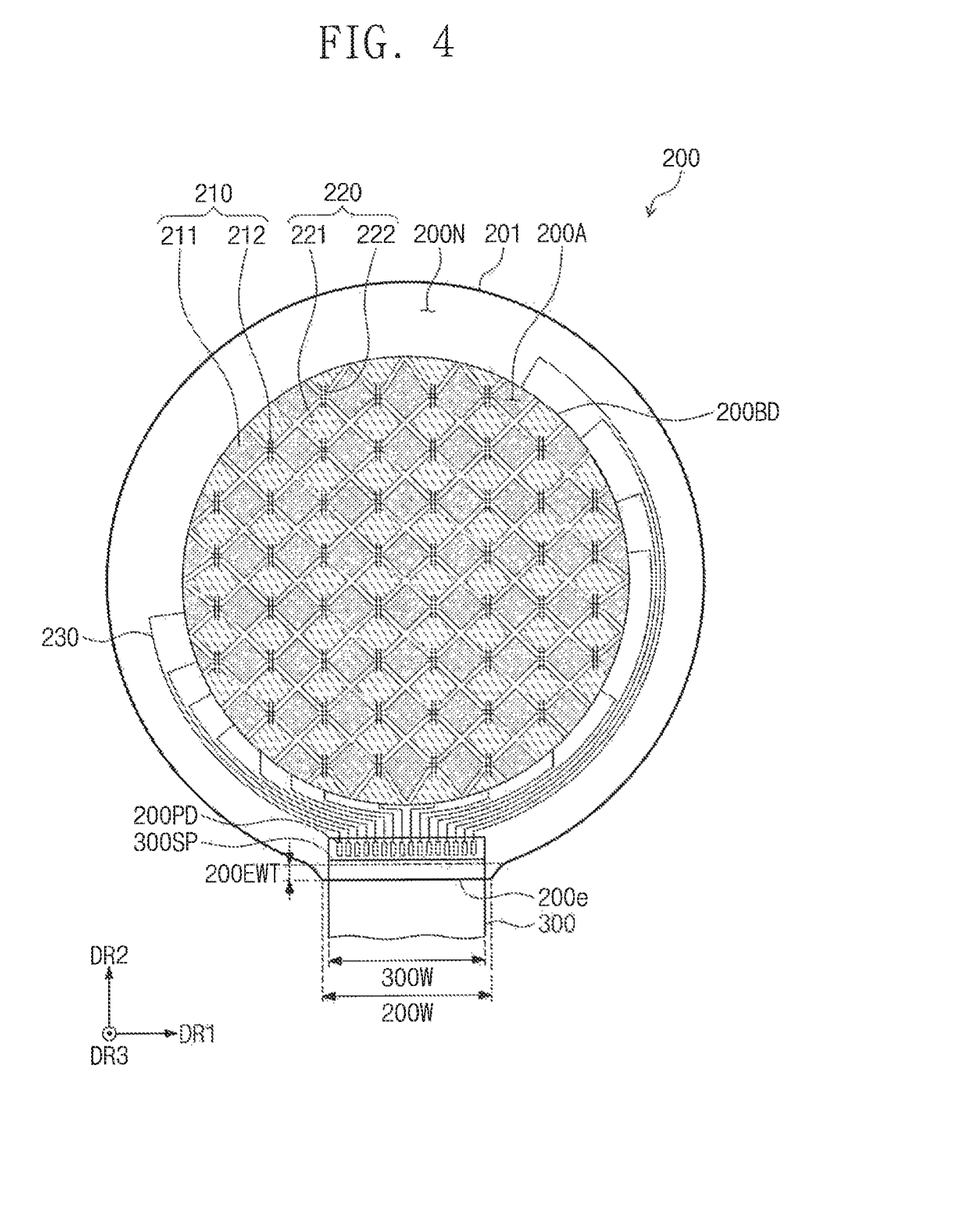
FIG. 4 is a plan view of a sensor layer according to an embodiment of the present inventive concepts.
Figure 5:
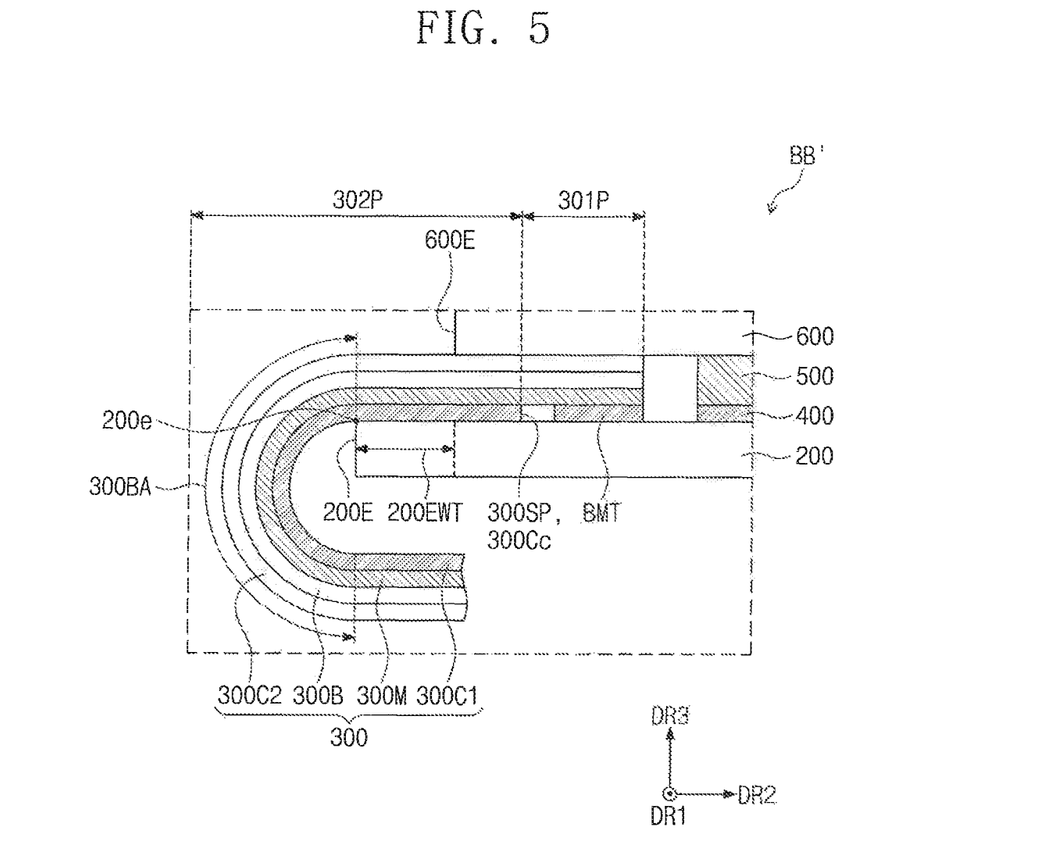
FIG. 5 is an enlarged cross-sectional view illustrating a portion of the electronic device which corresponds to region BB' of FIG. 2 according to an embodiment of the present inventive concepts.

FIG. 4 is a plan view of a sensor layer according to an embodiment of the present inventive concepts. FIG. 5 is an enlarged cross-sectional view illustrating a portion of the electronic device, which corresponds to region BB' of FIG. 2.

Referring to the embodiments of FIGS. 4 and 5, the touch panel 200 may have a sensing region 200A and a peripheral region 200N, both defined therein. The sensing region 200A may be a region which senses an external input and may be referred to as an active region. The peripheral region 200N may surround the sensing region 200A and be a region adjacent to the sensing region 200A. For example, as shown in the embodiment of FIG. 4, the peripheral region 200N may completely surround the sensing region 200A (e.g., in the first and second directions DR1, DR2). In an embodiment, the boundary 200BD between the sensing region 200A and the peripheral region 200N may be a curved line or a circle in a plan view.

The touch panel 200 may include a plurality of electrodes 210, a plurality of cross electrodes 220, a plurality of lines 230, and a plurality of pads 200PD. As shown in the embodiment of FIG. 4, the electrodes 210 and the cross electrodes 220 may be disposed in the sensing region 200A, and the lines 230 and the pads 200PD may be disposed in the peripheral region 200N. In an embodiment, the electronic device 1000 (see FIG. 1) may obtain coordinate information on an external input through a change in mutual capacitance between the electrodes 210 and the cross electrodes 220.

Each of the electrodes 210 ay extend along the first direction DR1, and the electrodes 210 may be arranged to be spaced apart from each other in the second direction DR2 crossing the first direction DR1. Each of the cross electrodes 220 may extend along the second direction DR2, and the cross electrodes 220 may be arranged to be spaced apart in the first direction DR1. The electrodes 210 and the cross electrodes 220 may cross each other.

Each of the electrodes 210 may include a first portion 211 and a second portion 212. Each of the cross electrodes 220 may include a sensing pattern 221 and a bridge pattern 222. The first portion 211 may be a portion that faces the sensing pattern 221, and the second portion 212 may be a portion that is insulated from and faces the bridge pattern. When viewed in a plan view, the second portion 212 may cross the bridge pattern 222.

In an embodiment, the electrodes 210 and the sensing pattern 221 may be disposed in the same layer as each other, and the bridge pattern 222 may be disposed in a layer different from those of the electrodes 210 and the sensing pattern 221. For example, in an embodiment, the electrodes 210 and the sensing pattern 221 may be included in the first conductive layer 202 (see FIG. 3), and the bridge pattern 222 may be included in the second conductive layer 204 (see FIG. 3), which may be referred to as a top bridge structure. However, embodiments of the present inventive concepts are not limited thereto. For example, in an embodiment, the electrodes 210 and the sensing pattern 221 may be included in the second conductive layer 204 (see FIG. 3), and the bridge pattern 222 may be included in the first conductive layer 202 (see FIG. 3), which may be referred to as a bottom bridge structure.

The lines 230 may be electrically connected to the electrodes 210 and the cross electrodes 220, respectively. The lines 230 may extend toward the pads 200PD. The lines 230 may be electrically connected to the pads 200PD, respectively. In an embodiment, the pads 200PD may be arranged to be spaced apart from each other in the first direction DR1. However, embodiments of the present inventive concepts are not limited thereto.

The second side 200E of the touch panel 200 may include an edge 200e extending along the first direction DR1. In an embodiment, the printed circuit film 300 may be electrically connected to the pads 200PD through an anisotropic conductive film BMT. The printed circuit film 300 may cover at least a portion of the edge 200e. The length 200W of the edge 200e (e.g., length in the first direction DR1) may be greater than the width 300W of the printed circuit film 300 (e.g., width in the first direction DR1). In this embodiment, when the printed circuit film 300 is bent, the printed circuit film may be entirely supported by the edge 200e.

When viewed in the thickness direction of the touch panel 200, the boundary 300SP of the first portion 301P and the second portion 302P may be defined between the edge 200e and the plurality of pads 200PD. In an embodiment, the boundary 300SP may extend along the first direction DR1.

As shown in the embodiment of FIG. 5, the printed circuit film 300 may include a base layer 300B, a conductive layer 300M disposed on a first surface of the base layer 300B, a coverlay 300C1 covering at least a portion of the conductive layer 300M, and a rear-surface coverlay 300C2 disposed on a second surface of the base layer 300B that is opposite to the first surface of the base layer 300B. However, embodiments of the present inventive concepts are not limited thereto and the elements and/or configurations of the printed circuit film 300 may vary. For example, in some embodiments, some of the above-described elements and/or configurations of the printed circuit film 300 may be omitted, or other elements and/or configurations may be further added.

In an embodiment, the base layer 300B may be a synthetic resin film or, for example, a film including a polyimide-based resin. The conductive layer 300M may include a plurality of lines. For example, the plurality of lines may be electrically connected to the plurality of pads 200PD, respectively.

In an embodiment, a rear-surface conductive layer may be further disposed between the base layer 300B and the rear-surface coverlay 300C2, and the rear-surface coverlay 300C2 may cover the rear-surface conductive layer. The coverlay 300C1 and the rear-surface coverlay 300C2 may be layers which serve to protect and insulate the conductive layer 300M and the rear-surface conductive layer. Each of the coverlay 300C1 and the rear-surface coverlay 300C2 may be referred to as a cover layer or an insulating layer. However, embodiments of the present inventive concepts are not limited thereto. For example, in an embodiment, the rear-surface coverlay 300C2 may be omitted.

The coverlay 300C1 may cover a portion of the conductive layer 300M and expose a portion of the conductive layer 300M. The conductive layer 300M exposed through the coverlay 300C1 may be electrically connected to the pads 200PD. The end 300Cc of the coverlay 300C1 may define the boundary 300SP. The end 300Cc of the coverlay 300C1 may be disposed on the touch panel 200 and may overlap the touch panel 200 (e.g., in the third direction DR3).

A portion of the printed circuit film 300 may be attached to the upper surface of the touch panel 200, and the remaining portion of the printed circuit film 300 may be bent toward the rear surface of the touch panel 200. For example, as shown in the embodiment of FIG. 5, the printed circuit film 300 may have a bending region 300BA defined therein. When the printed circuit film 300 is inserted into a connector of a main circuit board, stress may be applied to the printed circuit film 300.

In a comparative embodiment, when the end 300Cc of the coverlay 300C1 is defined in the bending region 300BA. force may be concentrated on the end 300Cc of the coverlay 300C1, causing the boundary 300SP to be bent or folded. Therefore, a crack may occur in the conductive layer 300M. However, according to an embodiment of the present inventive concepts, the end 300Cc of the coverlay 300C1 is not disposed in the bending region 300BA. For example, the end 300Cc of the coverlay 300C1 may extend to a region overlapping the touch panel 200 (e.g., in the third direction DR3). Therefore, there may be no region on which force is concentrated within the bending region 300BA When the printed circuit film 300 is bent. As a result, the probability that a crack occurs in the conductive layer 300M may be reduced, and accordingly, the reliability of the electronic device 1000 (see FIG. 1) may be increased.

The end 300Cc of the coverlay 300C1 may be disposed between the touch panel 200 and the optical film 600 (e.g., in the third direction DR3). For example, since the end 300Cc of the coverlay 300C1 is fixed between the touch panel 200 and the optical film 600, a phenomenon that a region adjacent to the end 300Cc of the coverlay 300C1 in the printed circuit film 300 is bent or folded may be prevented or eliminated.

In addition, the touch panel 200 may extend so that the second side 200E of the touch panel 200 protrudes (e.g., outwardly in the second direction DR2) more than the first side 600E of the optical film 600. Since the protruding, extended touch panel 200 is in direct contact with a portion of the printed circuit film 300, when the printed circuit film 300 is bent, stress received by the printed circuit film 300 may be relieved.

The width 200EWT of the extended portion (e.g., in the second direction DR2) of the touch panel 200 may be within a range in which the width of a bezel region is not increased. For example, the width 200EWT of the extended portion of the touch panel 200 may be smaller than the radius of curvature of the bending region 300BA.

Figure 6:
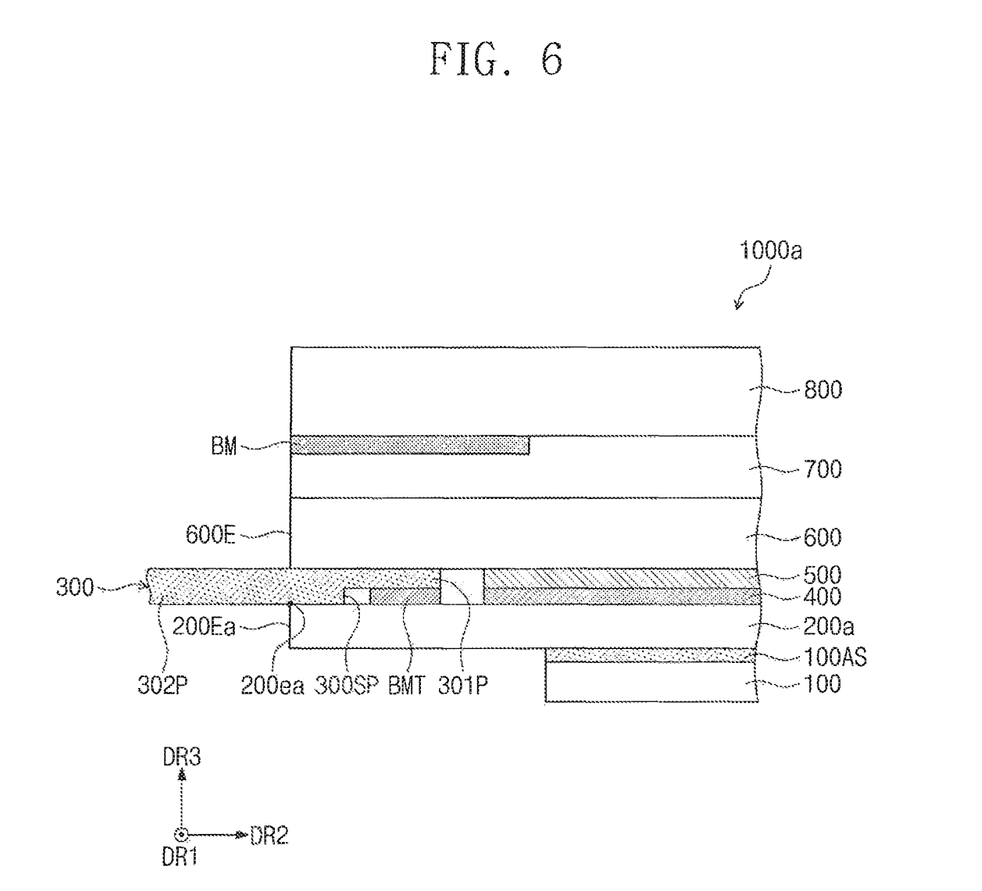
FIG. 6 is a cross-sectional view of an electronic device according to an embodiment of the present inventive concepts.
Figure 7:
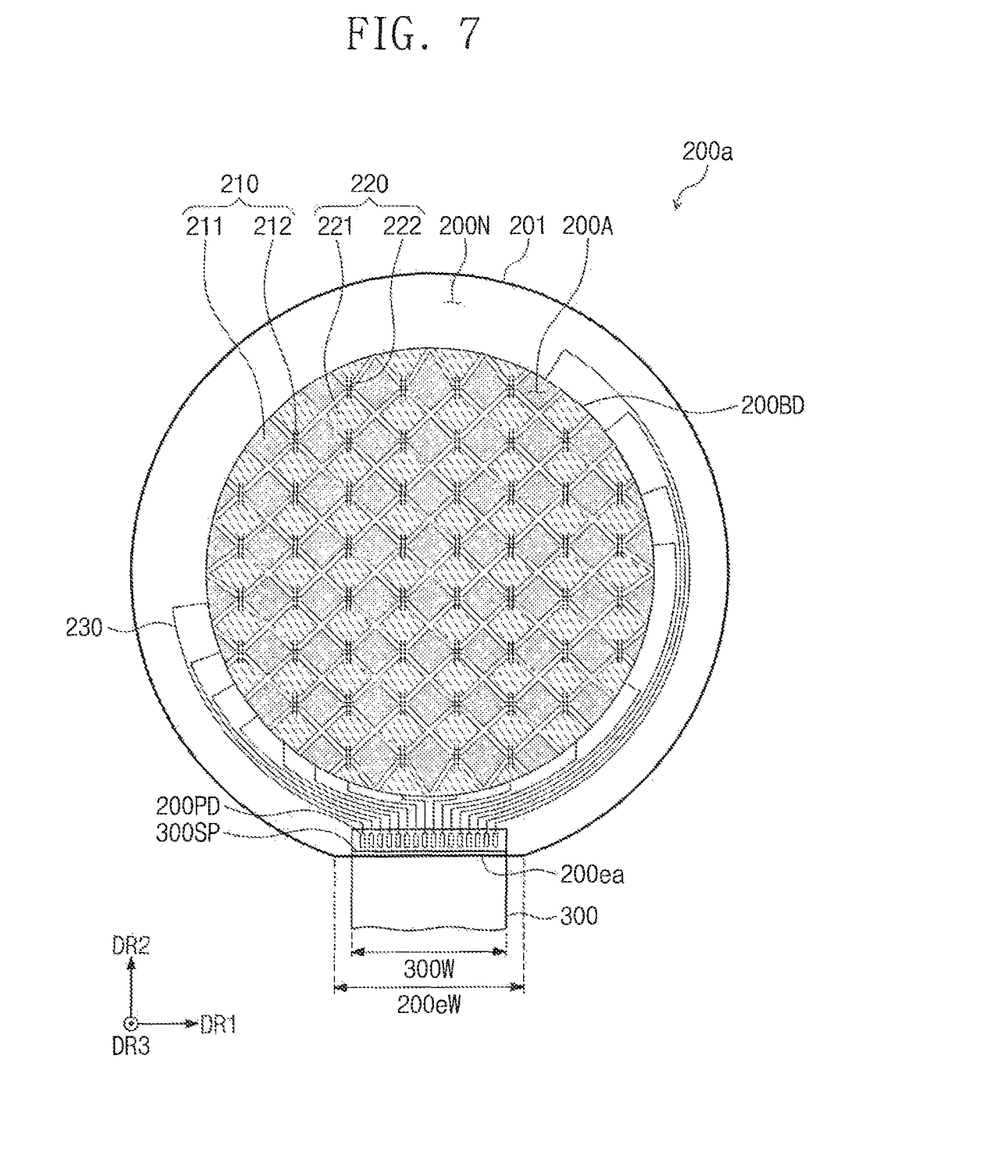
FIG. 7 is a plan view of a sensor layer according to an embodiment of the present inventive concepts.

FIG. 6 is a cross-sectional view of an electronic device according to an embodiment of the present inventive concepts. FIG. 7 is a plan view of a sensor layer according to an embodiment of the present inventive concepts.

Referring to the embodiments of FIGS. 6 and 7, the electronic device 1000a may include a display panel 100, a touch panel 200a, a printed circuit film 300, an insulating layer 400, an adhesive layer 500, an optical film 600, a window adhesive layer 700, and a window 800. However, embodiments of the present inventive concepts are not limited thereto. For example, in some embodiments, some of the elements and/or configurations described above may be omitted, or other elements and/or configurations may be further added.

When viewed in the thickness direction of the touch panel 200a, for example, in the third direction DR3, sides overlapping the printed circuit film 300 may be defined. For example, a first side 600E of the optical film 600 and a second side 200Ea of the touch panel 200a may be defined. When viewed in a plan view, the first side 600E of the optical film 600 and the second side 200Ea of the touch panel 200a may be aligned with each other. For example, as shown in the embodiment of FIG. 6, the first side 600E of the optical film 600 and the second side 200Ea of the touch panel 200a may be co-planar (e.g., in the second direction DR2).

The second side 200Ea of the touch panel 200a may include an edge 200ea extending in the first direction DR1. The printed circuit film 300 may be electrically connected to the pads 200PD through the anisotropic conductive film BMT. The printed circuit film 300 may cover at least a portion of the edge 200ea. The length 200eW of the edge 200ea (e.g., length in the first direction DR1) may be greater than the width 300W of the printed circuit film 300 (e.g., width in the first direction DR1).

The boundary 300SP between the first portion 301P of the printed circuit film 300 and the second portion 302P thereof may be disposed on the touch panel 200. As described above in FIG. 5, the boundary 300SP may correspond to the end 300Cc of the coverlay 300C1.

According to an embodiment of the present inventive concepts, the boundary 300SP, in which the thickness of the printed circuit film 300 changes, is disposed on the touch panel 200. For example, the boundary 300SP may not be disposed in the bending region 300BA (see FIG. 5) of the printed circuit film 300. Therefore, when the printed circuit film 300 is bent, a phenomenon that three is concentrated on a particular region such as the boundary 300SP may be prevented. As a result, the probability that a crack occurs in the conductive layer 300M (see FIG. 5) may be reduced, and accordingly, the reliability of the electronic device 1000a may be increased.

Figure 8:
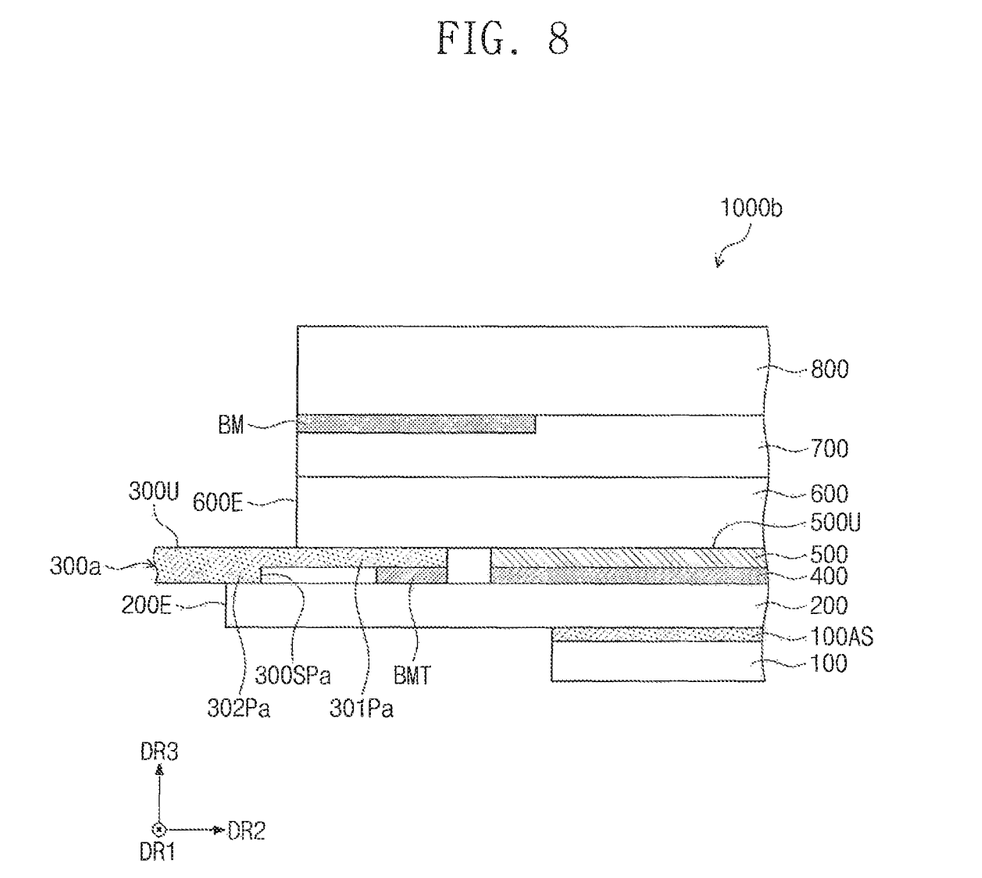
FIG. 8 is a cross-sectional view of an electronic device according to an embodiment of the present inventive concepts.

FIG. 8 is a cross-sectional view of an electronic device according to an embodiment of the present inventive concepts.

Referring to the embodiment of FIG. 8, the electronic device 1000b may include a display panel 100, a touch panel 200, a printed circuit film 300a, an insulating layer 400, an adhesive layer 500, an optical film 600, a window adhesive layer 700, and a window 800. However, embodiments of the present inventive concepts are not limited thereto. For example, in some embodiments, some of the elements and/or configurations described above may be omitted, or other elements and/or configurations may be further added.

The printed circuit film 300a may include a first portion 301Pa and a second portion 302Pa. The first portion 301Pa may have a thickness (e.g., length in the third direction DR3) that is less than the thickness of the second portion 302Pa. A portion of the first portion 301Pa may be disposed between the optical film 600 and the touch panel 200 (e.g., in the third direction DR3). A portion of the first portion 301PA may extend outwardly (e.g., in the second direction DR2) from the optical film 600. The optical film 600 may be attached to a portion of the upper surface of the first portion 301Pa. The optical film 600 may not directly contact the second portion 302Pa of the printed circuit film 300a.

When viewed in a plan view, for example, such as when viewed in the third direction DR3, a boundary 300SPa between the first portion 301Pa and the second portion 302Pa may be disposed between the first side 600E of the optical film 600 and the second side 200E of the touch panel 200 (e.g., in the second direction DR2) and the boundary 300SPa may be spaced apart from the optical film 600 (e.g., in the second direction DR2).

The boundary 300SPa between the first portion 301Pa and the second portion 302Pa may be disposed on the touch panel 200. For example, when viewed in the thickness direction of the touch panel 200, for example, in the third direction DR3, the boundary 300SPa between the first portion 301Pa and the second portion 302Pa may overlap the touch panel 200. In addition, at least a portion of the second portion 302Pa of the printed circuit film 300a may be in direct contact with the touch panel 200.

According to an embodiment of the present inventive concepts, the boundary 300SPa, in which the thickness of the printed circuit film 300a changes, is disposed on the touch panel 200. For example, the boundary 300SPa may not be disposed in the bending region 300BA (see FIG. 5) of the printed circuit film 300a. Therefore, when the printed circuit film 300a is bent, the phenomenon of three being concentrated on a particular region such as the boundary 300SPa may be prevented. As a result, the probability that a crack occurs in the conductive layer 300M (see FIG. 5) may be reduced, and accordingly, the reliability of the electronic device 1000b may be increased.

Figure 9:
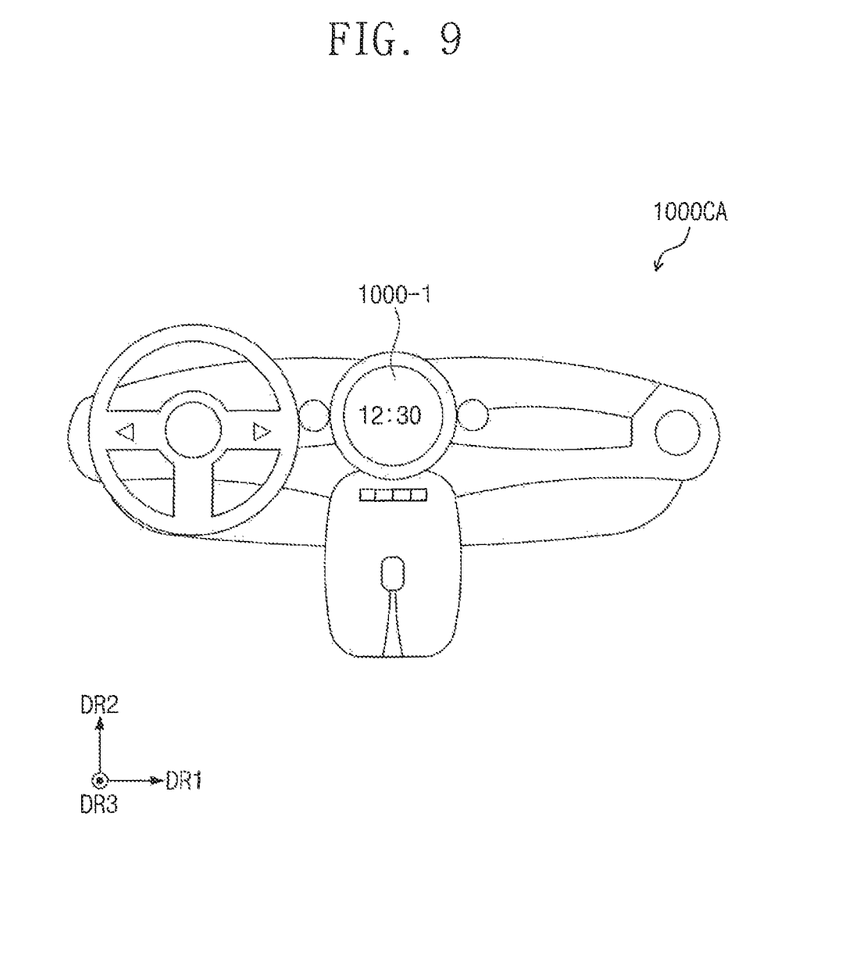
FIG. 9 is an application example of an electronic device according to an embodiment of the present inventive concepts.

FIG. 9 is an application example of an electronic device according to an embodiment of the inventive concept.

Referring to the embodiment of FIG. 9, the electronic device 1000-1 may be applied to a car 1000CA, such as a car dashboard.

The electronic device 10000-1 may display at least one moving and/or still image and sense an external input applied from the outside. For example, in an embodiment, the electronic device 1000-1 may display various kinds of information for driving a car, such as navigation information, icons for operating various systems such as an air conditioner, a heater, an audio system, and an air circulation system, or images of the rear of the car 1000CA. A user may operate the electronic device 1000-1 by touching the sensing region (e.g., the active region).

While the embodiments of FIGS. 1 and 9 illustrate, as an example, two application examples to which the electronic device 1000 or 10000-1 is applied, embodiments of the present inventive concepts are not particularly limited thereto. For example, the electronic device 1000 or 1000-1 may be applied to various electronic products, such as a mobile phone, a tablet computer, a navigation system, a notebook computer, or the like.

According to the above descriptions, the portion (hereinafter, referred to as the boundary) in which the thickness of the printed circuit film changes is disposed on the touch panel. For example, the boundary of the printed circuit film may not be disposed in the bending region of the printed circuit film. Therefore, when the printed circuit film is bent, the phenomenon that force is concentrated on a particular region such as the boundary may be prevented. As a result, the probability that a crack occurs in the conductive layer of the printed circuit film may be reduced, and accordingly, the reliability of the electronic device may be increased.

A portion of the printed circuit film may be disposed between the optical film and the touch panel, and a portion of the optical film may be attached to a portion of the upper surface of the punted circuit film. In addition, the boundary of the printed circuit film may be disposed between the optical film and the touch panel in the third direction DR3). For example, since the boundary of the printed circuit film has a shape fixed between the touch panel and the optical film, the phenomenon that the boundary of the printed circuit film is bent or folded may be prevented or eliminated. Accordingly, the reliability of the electronic device may be increased.

Although the present inventive concepts have been described with reference to the above embodiments, those skilled in the art will understand that various modifications and changes can be made to the present inventive concepts without departing from the spirit and scope of the present inventive concepts.

Therefore, the scope of the present inventive concepts should not be limited to the contents described in the detailed description of embodiments thereof.

What is claimed is:

1. An electronic device, comprising:
   a display panel;
   a touch panel disposed on the display panel; and
   a printed circuit film electrically connected to the touch panel and comprising a first portion having a first thickness, and a second portion having a second thickness greater than the first thickness,
   wherein a boundary between the first portion and the second portion overlaps the touch panel in a thickness direction of the touch panel and at least a portion of the second portion contacts the touch panel,
   wherein an edge of the first portion is an edge of the printed circuit film, and
   wherein each of the boundary and the edge of the first portion extends in a first direction, and the boundary and the edge of the first portion are spaced apart from each other in a second direction crossing the first direction.

2. The electronic device of claim 1, further comprising an optical film disposed on the touch panel,
   wherein the first portion is disposed between the optical film and the touch panel.

3. The electronic device of claim 2, wherein the boundary between the first portion and the second portion is disposed between the optical film and the touch panel.

4. The electronic device of claim 2, wherein a first side of the optical film and a second side of the touch panel overlap the second portion of the printed circuit film in a plan view.

5. The electronic device of claim 4, wherein the second side of the touch panel protrudes more than the first side of the optical film in the plan view.

6. The electronic device of claim 4, wherein the second side of the touch panel is aligned with the first side of the optical film in the plan view.

7. The electronic device of claim 2, wherein the optical film is attached to a first surface of the printed circuit film.

8. The electronic device of claim 2, further comprising:
   an adhesive layer disposed between the optical film and the touch panel; and
   an insulating layer disposed between the adhesive layer and the touch panel,
   wherein the adhesive layer and the insulating layer are spaced apart from the printed circuit film in the second direction.

9. The electronic device of claim 8, wherein:
   the optical film is attached to upper surfaces of the adhesive layer and the printed circuit film; and
   the upper surface of the adhesive layer is aligned with the upper surface of the printed circuit film in the second direction.

10. The electronic device of claim 1, wherein the printed circuit film comprises:
    a base layer,
    a conductive layer disposed on a first surface of the base layer; and
    a coverlay configured to cover the conductive layer,
    wherein the boundary is defined by an end of the coverlay.

11. The electronic device of claim 10, wherein the coverlay contacts the touch panel.

12. The electronic device of claim 1, wherein:
    the touch panel comprises an edge extending in the first direction;
    the printed circuit film covers at least a portion of the edge of the touch panel; and
    a length of the edge of the touch panel in the first direction is greater than a width of the printed circuit film in the first direction.

13. The electronic device of claim 12, wherein:
    the touch panel has a sensing region for sensing an external input and a peripheral region adjacent to the sensing region,
    the touch panel comprises a plurality of electrodes disposed in the sensing region and a plurality of pads disposed in the peripheral region and arranged along the first direction; and
    when viewed in the thickness direction, the boundary between the first portion and the second portion is disposed between the edge of the touch panel and the plurality of pads.

14. The electronic device of claim 13, wherein a boundary between the sensing region and the peripheral region is a curved line or a circle in a plan view.

15. An electronic device, comprising:
    a display panel;
    a touch panel disposed on the display panel;
    a printed circuit film electrically connected to the touch panel; and
    an optical film disposed on the touch panel,
    wherein:
    the printed circuit film comprises a base layer, a conductive layer disposed on a first surface of the base layer, and a coverlay configured to cover at least a portion of the conductive layer;
    a portion of the printed circuit film is disposed between the optical film and the touch panel in a thickness direction of the touch panel;
    an end of the coverlay is disposed on the touch panel;
    a first side of the optical film and a second side of the touch panel overlap the printed circuit film in a plan view; and
    the second side of the touch panel protrudes more than the first side of the optical film in the plan view.

16. The electronic device of claim 15, wherein the end of the coverlay is disposed between the optical film and the touch panel.

17. The electronic device of claim 15, wherein, when viewed in the thickness direction, the end of the coverlay is spaced apart from the optical film in a direction parallel to an upper surface of the touch panel.

18. The electronic device of claim 15, wherein the first side of the optical film and the second side of the touch panel overlap the coverlay of the printed circuit film in the plan view.

19. The electronic device of claim 15, wherein:
the touch panel comprises an edge extending along a first direction;
the printed circuit film covers at least a portion of the edge, and
a length of the edge in the first direction is greater than a width of the printed circuit film in the first direction.

20. An electronic device, comprising:
a display panel;
a touch panel disposed on the display panel; and
a printed circuit film electrically connected to the touch panel and comprising a first portion having a first thickness, and a second portion having a second thickness greater than the first thickness,
wherein a boundary between the first portion and the second portion contacts the touch panel,
wherein an edge of the first portion is an edge of the printed circuit film, and
wherein each of the boundary and the edge of the first portion extends in a first direction, and the boundary and the edge of the first portion are spaced apart from each other in a second direction crossing the first direction.

\* \* \* \* \*